US006100110A

United States Patent [19]

Kawase et al.

[11] Patent Number: 6,100,110

[45] Date of Patent: Aug. 8, 2000

[54] METHODS OF MAKING THERMISTOR CHIPS

[75] Inventors: Masahiko Kawase; Hidenobu Kimoto; Norimitsu Kito; Ikuya Taniguchi, all of Shiga, Japan

[73] Assignee: Murata Manufacturing Co., Ltd., Kyoto, Japan

[21] Appl. No.: 09/304,900

[22] Filed: May 4, 1999

Related U.S. Application Data

[62] Division of application No. 08/943,724, Oct. 3, 1997, Pat. No. 5,952,911.

[30] Foreign Application Priority Data

Oct. 9, 1996 [JP] Japan .................................... 8-268398

[51] Int. Cl.[7] .................................................... H01L 21/00

[52] U.S. Cl. ................................ 438/54; 438/55; 438/381

[58] Field of Search ................................ 438/54, 55, 381, 438/382

[56] References Cited

U.S. PATENT DOCUMENTS

| | | |
|---|---|---|
| 3,645,785 | 2/1972 | Hentzchel . |
| 4,831,432 | 5/1989 | Hori et al. . |
| 5,257,003 | 10/1993 | Mahony . |
| 5,294,910 | 3/1994 | Tani et al. . |
| 5,339,068 | 8/1994 | Tsunoda et al. . |
| 5,493,266 | 2/1996 | Sasaki et al. . |
| 5,534,843 | 7/1996 | Tsunoda et al. . |
| 5,963,416 | 10/1999 | Honda et al. .......................... 29/25.42 |
| 6,023,403 | 2/2000 | McGuire et al. ....................... 361/106 |

FOREIGN PATENT DOCUMENTS

| | | |
|---|---|---|
| 308306 | 3/1989 | European Pat. Off. . |
| 4029681 | 9/1990 | Germany . |
| 4-127401 | 11/1990 | Japan . |
| 03250601 | 11/1991 | Japan . |
| 6-295803 | 4/1993 | Japan . |
| 5/258906 | 10/1993 | Japan . |
| 08078279 | 3/1996 | Japan . |
| 08138902 | 3/1996 | Japan . |
| 9016074 | 12/1990 | WIPO . |

*Primary Examiner*—Kevin M. Picardat
*Attorney, Agent, or Firm*—Majestic, Parsons, Siebert & Hsue P.C.

[57] ABSTRACT

A thermistor chip is made by first forming first metal layers with a three-layer structure at both end parts of a thermistor block and then forming second metal layers with a three-layer structure on the first metal layers so as to have edge parts that are formed directly in contact with a surface area of the thermistor block and will reduce its normal temperature resistance value. The first and second metal layers are each of a three-layer structure with a lower layer made of a metal with resistance against soldering heat, a middle layer made of a metal with both wettability to solder and resistance against soldering heat, and an upper layer made of a metal having wettability to solder.

14 Claims, 3 Drawing Sheets

METHODS OF MAKING THERMISTOR CHIPS

This is a division of application Ser. No. 08/943,724, filed Oct. 3, 1997, now U.S. Pat. No. 5,952,911.

BACKGROUND OF THE INVENTION

This invention relates methods of making to thermistor chips with reduced fluctuations in the normal-temperature resistance values.

As shown in FIGS. 11 and 12, a conventional thermistor chip 1 of this kind usually has terminal electrodes 3 provided at both end parts of a thermistor block 2 having an oxide of a transition metal such as Mn, Co and Ni as its principal component. The terminal electrodes 3 each comprise an end electrode 3*a* formed by applying Ag/Pd or the like in a paste form and then firing and a plating layer 3*b* formed on its surface by using Ni or Sn. The normal-temperature resistance value (hereinafter simply referred to as "the resistance value") of such a thermistor chip is generally determined by the resistor value of the thermistor block 2 and the position of the terminal electrodes 3.

Fluctuations in the position of the end electrodes 3*a*, or more particularly in their width d and their separations a, are generally large because they are produced by applying a paste and firing. The so-called "3 cv" value (an index of fluctuations defined as $100\times3\sigma$/(average value) where $\sigma$ indicates the standard deviation of fluctuations in a lot) for the resistance values is conventionally as large as 5–20%. In order to reduce it to less than 1%, as currently becoming required of the resistant values, a sorting process is necessary, and this not only affects the production cost adversely but also makes it difficult to supply a large quantity of products.

Although it has been known to make use of a laser to remove a portion of the terminal electrode 3 so as to adjust the resistance value of a thermistor chip, the use of a laser involves several problems of its own such as damage to the thermistor block due to the laser heat. In the case of a thermistor of which the resistance changes nonlinearly with respect to temperature, the adjustment of the temperature value is difficult as the temperature of the thermistor block rises due to the laser heat.

SUMMARY OF THE INVENTION

It is therefore a general object of this invention to eliminate the problems of prior art as described above.

It is a specific object of this invention to provide a method of producing chip type thermistors of which the standard deviation in the fluctuations in the resistance value is reduced.

It is another object of this invention to provide such a method without using a laser.

A method of production embodying this invention may be characterized as comprising the steps of forming first metal layers each having a three-layer structure on both end parts of a thermistor block, forming second metal layers each having a three-layer structure above the first metal layers such that their edge parts are in contact with surface areas of the thermistor block, and adjusting the resistance value of the thermistor block. According to an alternative method, first metal layers are formed as described above, the resistance value of the thermistor block is measured, second metal layers are formed as described above on the basis of the measured resistance value and the resistance value is adjusted to a specified resistance value. The lower layer of the three-layer structures of the first and second metal layers comprises a metal with resistance against soldering heat, the middle layer comprises a metal having both wettability to solder and resistance against soldering heat and the upper layer comprises a metal having wettability to solder. It is preferable that the lower layers comprise a material selected from Cr, Ni, Al, W and their alloys, that the middle layers comprise Ni or a Ni alloy and that the upper layers comprise Sn, a Sn—Pb alloy or Ag. It is further preferred that the first and second metal layers be formed by a dry soldering method. By a method as described above, it is possible to make thermistor chips having only small fluctuations in the resistance values.

BRIEF DESCRIPTION OF THE DRAWINGS

The accompanying drawings, which are incorporated in and form a part of this specification, illustrate embodiments of the invention and, together with the description, serve to explain the principles of the invention. In the drawings.

Throughout herein, like components may be indicated by the same numeral even if belonging to different thermistor chips and repetitive explanations may be omitted for simplifying the disclosure. It is also to be reminded that these figures are intended to be schematic and not true to scale. The metal layers, in particular, are generally much thinner than the thickness of the thermistor block, and hence the indications of distances in the figures are provided by ignoring the thickness of the metal layers.

DETAILED DESCRIPTION OF THE INVENTION

Figure 1:
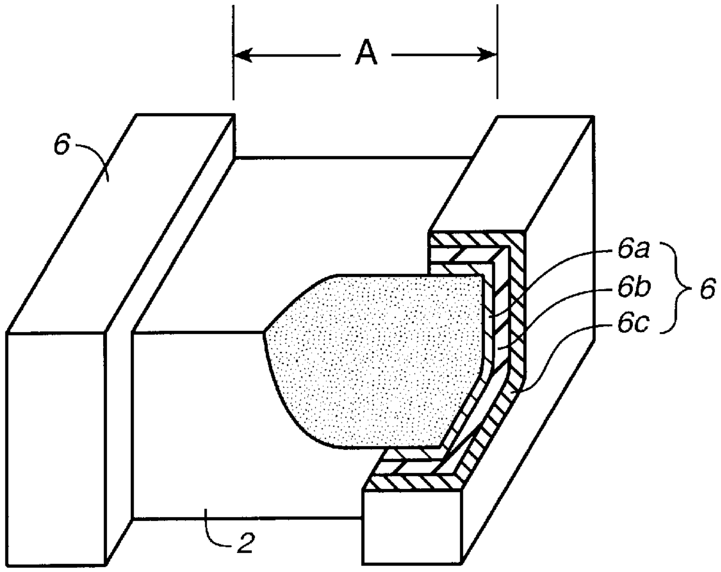
FIG. 1 is a partially cut diagonal view of an intermediate product obtained by forming first metal layers on a thermistor block for the production of a thermistor chip according to a first embodiment of this invention.
Figure 2:
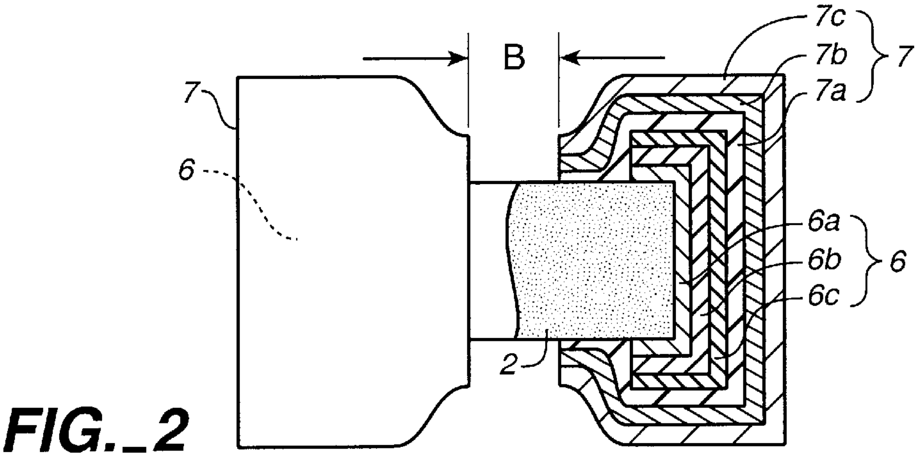
FIG. 2 is a partially sectional view of a thermistor chip according to the first embodiment of this invention.

The invention will be described next with reference to a thermistor chip actually produced as a first embodiment of this invention. Thermistor blocks 2 with length 2.0 mm, width 1.2 mm and height 0.8 mm were prepared and first metal layers 6 of a three-layer structure were formed on both end parts as shown in FIGS. 1 and 2 by a dry soldering method such as by sputtering such that the separation A between their mutually opposite edge parts was 1.3 mm. The three-layer structure was formed by using Ni—Cr with resistance against soldering heat as lower thin-film layer 6*a* with thickness 0.4 μm, Ni—Cu having both wettability to solder and resistance against soldering heat as middle thin-film layer 6*b* with thickness 0.8 μm and Ag having wettability to solder as upper thin-film layer 6*c* with thickness 0.8 μm.

Although Ni—Cu was used in the particular example, described above for the lower layers 6*a*, Cr, Ni, Al, W and their alloys may be used alternatively. Similarly, Ni and Ni alloys may be used for the middle layers 6*b*, and Sn and Sn alloys may be used for the upper layers 6*c*. The thickness of each layer may be appropriately varied.

The resistance value of the thermistor block 2 shown in FIG. 1 was measured by using the first metal layers 6 as electrodes. The average value of twenty samples was 10KΩ and the "3 cv" of the resistance values was 15%. The lot of these samples was then divided into eleven ranks, as shown in Table 1, each corresponding to a range of 0.3KΩ in resistance. The average resistance values each corresponding to associated one of the ranks are also shown in Table 1.

Next, second metal layers 7 were formed by a dry soldering method such as sputtering on each of the ranked thermistor blocks 2 such that their resistance values will fall within a specified range R=8±0.2KΩ. As shown in FIG. 2, the second metal layers 7 are also of a three-layer structure (with a lower layer 7*a* of Ni—Cr with thickness 0.4 μm, a middle layer 7*b* of Ni—Cu with thickness 0.8 μm and an upper layer 7*c* of Ag with thickness 0.8 μm) both on the surface of the first metal layers 6 and, extending therefrom, on a surface area of the chip type thermistor block 2. The distance B (such that B<A) between the mutually opposite edge parts of the second metal layers 7 was selected, depending on the resistance value of each rank, as shown in Table 1.

The resistance values of such adjusted thermistor chips were measured and are also listed in Table 1.

TABLE 1

| Rank | Range of Resistance (KΩ) | A (m) | Average Resistance (KΩ) | B (mm) | Average Resistance (KΩ) After Adjustment |
|---|---|---|---|---|---|
| 1 | 11.5< | 1.3 | 11.65 | 0.91 | 8.01 |
| 2 | 11.5–11.2 | " | 11.32 | 0.93 | 8.12 |
| 3 | 11.2–10.9 | " | 11.04 | 0.95 | 8.03 |
| 4 | 10.9–10.6 | " | 10.76 | 0.98 | 8.19 |
| 5 | 10.6–10.3 | " | 10.44 | 1.01 | 8.00 |
| 6 | 10.3–10.0 | " | 10.10 | 1.04 | 8.06 |
| 7 | 10.0–9.7 | " | 9.85 | 1.07 | 8.04 |
| 8 | 9.7–9.4 | " | 9.56 | 1.10 | 8.12 |
| 9 | 9.4–9.1 | " | 9.24 | 1.13 | 7.91 |
| 10 | 9.1–8.8 | " | 8.99 | 1.17 | 7.85 |
| 11 | 8.8–8.5 | " | 8.72 | 1.21 | 7.81 |

As can be understood from Table 1, the difference between the maximum and minimum resistance values of the thermistor chips in this lot right after the first metal layers were formed was about 3KΩ, but this was reduced to about 0.38KΩ after the second metal layers were formed to reduce the separation distance between the edges of the electrodes from A to B for each rank. Thus, the present invention makes it possible to provide thermistor chips having a desired resistance value with reduced fluctuations.

As explained above with reference to the first metal layers, the lower layer 7*a* of the second metal layers 7 may alternatively comprise Cr, Ni, Al, W or their alloy, the middle layer 7*b* may comprise Ni or a Ni alloy and the upper layer 7*c* may comprise Sn or a Sn—Pb alloy.

Figure 3:
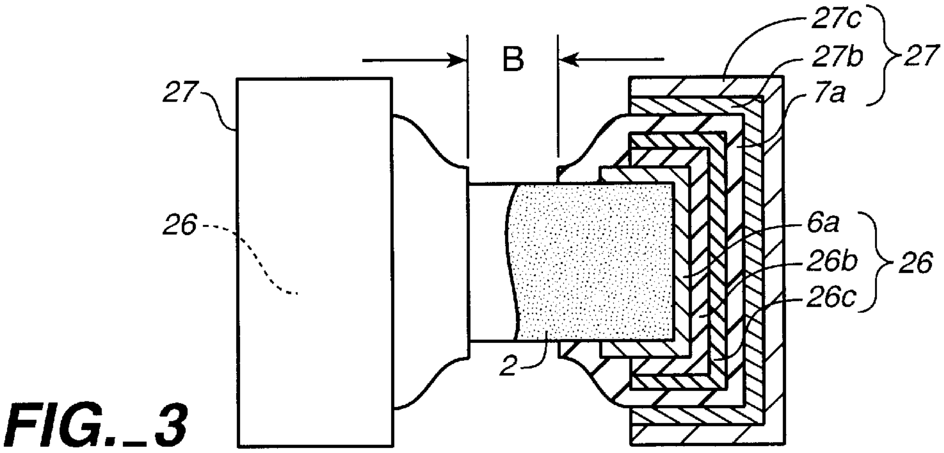
FIG. 3 is a partially sectional view of a thermistor chip according to a second embodiment of the invention.

A second embodiment of this invention is explained next with reference to FIG. 3. As can be understood by comparing it with FIG. 2, this embodiment is characterized wherein the middle and upper layers 26*b*, 26*c*, 27*b* and 27*c* of the first and second metal layers 26 and 27 have smaller areas than the respective lower layers 6*a* and 7*a* such that their mutually opposite edge parts are not covered by the overlapping layers. Such a thermistor chip is produced, after the lower layers 6*a* are formed at both end parts of the thermistor block 2, by forming the middle and upper layers 26*b* and 26*c* with a smaller area than the lower layers 6*a* such that the mutually opposite edge parts of the lower layers 6*a* will be exposed.

As in the first embodiment of the invention, the resistance values of thermistor blocks 2 thus having first metal layers 26 formed thereon are measured, and second metal layers 27 are formed on ranked thermistor blocks 2 according individually to the measured resistance value such that a specified resistance value will result. The second metal layers 27 are formed such that their mutually opposite edge parts are separated by a distance B, smaller than A, determined for each rank. Middle and upper layers 27*b* and 27*c* are formed so as to have a smaller area than the lower layer 7*a*. This embodiment is advantageous in that the area of the middle and upper layers 26*b*, 26*c*, 27*b* and 27*c* can be independent of the areas of the lower layers 6*a* and 7*a* dictated by the desired separation distance B such that soldering onto a circuit board or the like can be carried out uniformly. The middle and upper layers 26*b*, 26*c*, 27*b* and 27*c* of the first and second metal layers 6 and 7 according to this embodiment may made of the same materials respectively as the middle and upper layers 6*b*, 7*b*, 6*c* and 7*c* of the first embodiment.

Figure 4:
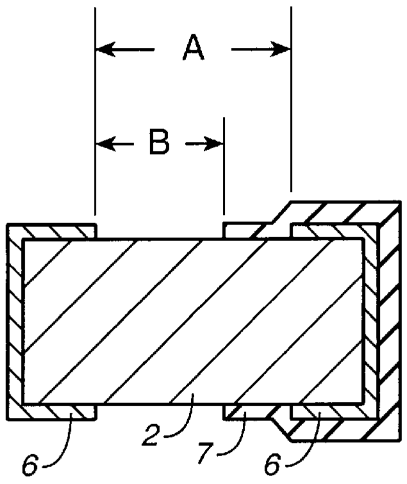
FIG. 4 is a sectional view of a thermistor chip according to a third embodiment of the invention.

A third embodiment of this invention is explained next with reference to FIG. 4, which is similar to FIG. 2 but the second metal layer 7 is formed only at one of the end parts of its thermistor block 2.

As explained above, the thermistor blocks 2 are ranked according to the measured resistance values, and the second metal layer 7 is formed on the surface of one of the first metal layers 6 and extending therefrom from its edge part onto a surface area of the thermistor block 2 so as to obtain a desired resistance value. The distance B between the edge part of the second metal layer 7 and the opposite one of the first metal layers 6 is determined for each rank. With the second metal layer 7 thus formed on each thermistor block to adjust the resistance value, thermistor chips with reduced fluctuations in the resistance values can be obtained.

Figure 5:
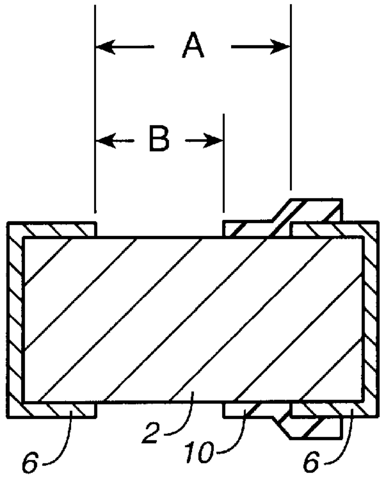
FIG. 5 is a sectional view of a thermistor chip according to a fourth embodiment of the invention.

A fourth embodiment of this invention is explained next with reference to FIG. 5, which is similar to FIG. 4 but its second metal layer 10 is formed so as to cover only the edge part of one of the first metal layers 6. In other respects, this embodiment is the same as the third embodiment.

Thus, as explained above, thermistor blocks 2 are ranked according to the measured resistance values, and the second metal layer 10 of a three-layer structure as explained above is formed over the edge part of one of the first metal layers 6 and extending from this edge part onto a surface area of the thermistor block 2 so as to obtain a desired resistance value. The distance B between the edge part of the second metal layer 10 and the opposite one of the first metal layers 6 is determined for each rank. With the second metal layer 10 thus formed on each thermistor block to adjust the resistance value such that thermistor chips with reduced fluctuations in the resistance values can be obtained.

A fifth embodiment of the invention is explained next with reference to FIG. 6 which is similar to FIG. 1 except a second metal layer 11 is formed to cover only a portion of the edge parts with a limited length E along the edge of one of the first metal layers 6.

As explained above, thermistor blocks 2 are ranked according to the measured resistance values, and the second metal layer 11 of a similar three-layer structure as explained above is formed over the edge part of one of the first metal layers 6, covering the limited distance E along the edge, and extending from this edge part onto a surface area of the thermistor block 2 so as to obtain a desired resistance value. The distance C between the edge part of the second metal layer 11 and the opposite one of the first metal layers 6 is determined for each rank. With the second metal layer 11 thus formed on each thermistor block to adjust the resistance value such that thermistor chips with reduced fluctuations in the resistance values can be obtained.

Figure 6:
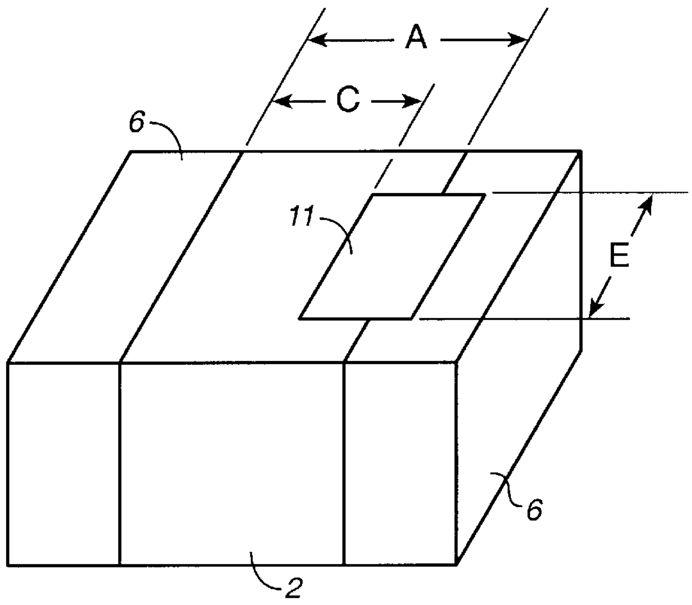
FIG. 6 is a diagonal view of a thermistor chip according to a fifth embodiment of the invention.

Although FIG. 6 shows a particular example of the fifth embodiment wherein the second metal layer 11 is formed on only one of the side surfaces of the thermistor block 2, a similar second metal layer may be formed on two or three of the side surfaces of the thermistor block 2 to adjust its resistance value. Moreover, two second metal layers may be formed at two places, each connecting to a different one of the first metal layers 6.

Figure 7:
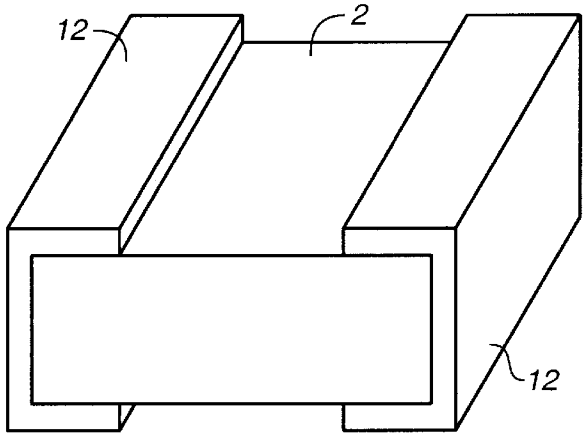
FIG. 7 is a diagonal view of an intermediate product obtained by forming first metal layers on a thermistor block according to a sixth embodiment of the invention.
Figure 11:
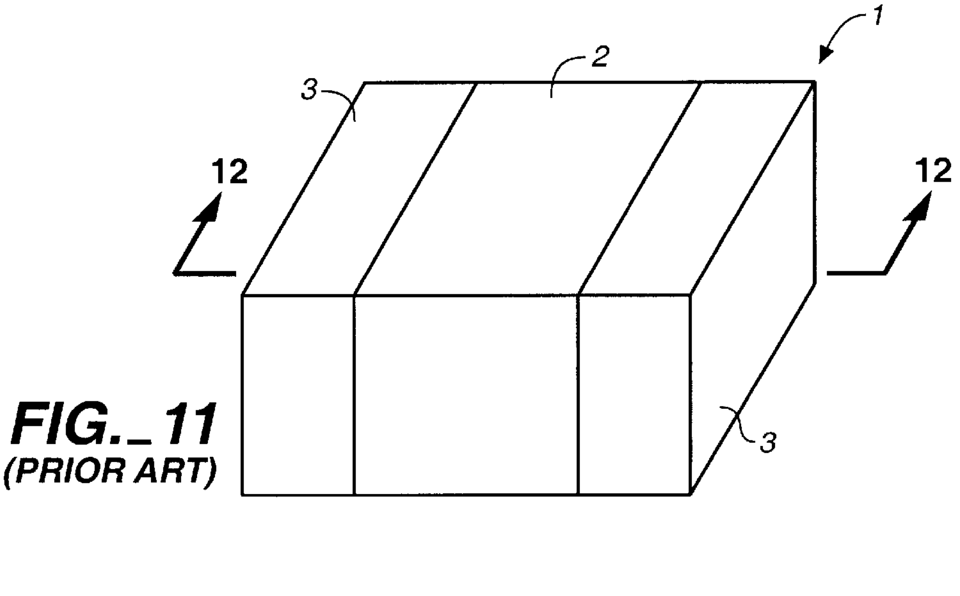
FIG. 11 (PRIOR ART)
FIG. 11 is diagonal view of a prior art thermistor chip.

A sixth embodiment of the invention is shown in FIG. 7, which is similar to the first embodiment shown in FIG. 1 but is different wherein its second metal layers 12 are formed by leaving the side surfaces of the thermistor block 2 exposed. As shown in FIG. 7, the second metal layers 12 are formed on both end surfaces of the thermistor block 2 and portions of its upper and lower surfaces adjacent the end surfaces but not on the side surfaces which remain exposed.

As explained above with reference to the fifth embodiments, thermistor blocks 2 were provided and first metal layers 12 having a three-layer structure were formed as shown in FIG. 7. After the resistance values of these thermistor blocks were measured, second metal layers of various shapes as shown in FIGS. 2–6 were formed on the basis of the measured resistance values. Their resistance values were adjusted, and thermistor chips with small fluctuations could thus be obtained.

The invention has been described above with reference to thermistor blocks of the kind not having any internal electrodes. Since this invention is applicable to thermistor blocks with internal electrodes, such examples will be described next with reference to FIGS. 8–10.

Figure 8:
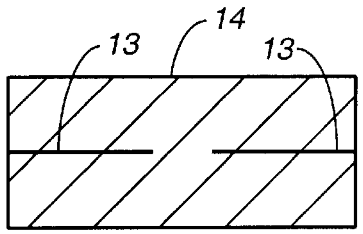
FIG. 8 is a sectional view of a thermistor block according to the seventh embodiment of the invention.
Figure 9:
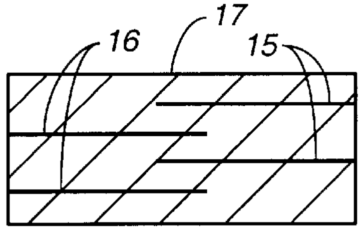
FIG. 9 is a sectional view of a thermistor block according to the eighth embodiment of the invention.
Figure 12:
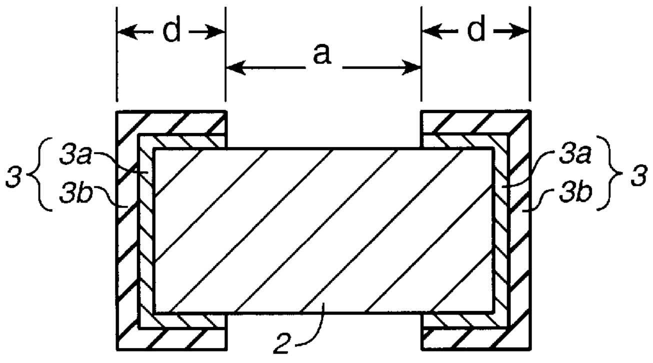
FIG. 12 (PRIOR ART)
FIG. 12 is a sectional view of the prior art thermistor chip of FIG. 11 taken along line 12—12.
Figure 10:
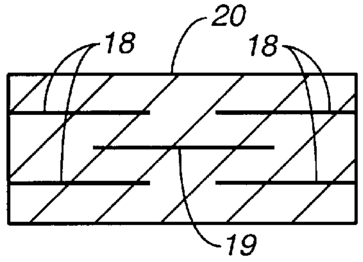
FIG. 10 is a sectional view of a thermistor block according to the ninth embodiment of the invention.

FIG. 8 shows a seventh embodiment of the invention where use is made of a thermistor block 14 having a pair of internal electrodes 13 disposed mutually separated but on a same plane inside the block 14. FIG. 9 shows an eighth embodiment of the invention where use is made of a thermistor block 17 having internal electrodes 15 and 16 which are not in coplanar relationship but overlap mutually. FIG. 10 shows an ninth embodiment of the invention where use is made of a thermistor block 20 having two pairs of mutually coplanar, mutually separated internal electrodes 18 as well as a separated internal electrode 19 which is not coplanar with any of the other internal electrodes 18 and is not connected. The number of internal electrodes 13, 15, 16, 18 and 19 is not intended to limit the scope of the invention.

Advantages of the present invention include the following:

(1) Since the first metal layers extend farther than the second metal layers towards the center of the thermistor block, the resistance value of the thermistor chip is determined by the first metal layers and hence thermistor chips with smaller resistance values can be obtained;

(2) Since the fourth metal layers are formed over the first metal layers to adjust the resistance values, thermistor chips with smaller standard variations in the fluctuation of their resistance values can be obtained easily;

(3) Since the second and third metal layers for soldering are formed with the same size although the separating distances between the mutually opposite edge parts of the first or fourth metal layers are varied according to a specified resistance value, the areas for applying solder for attaching the thermistor chip to a circuit board can remain the same, occurrence of tombstones and solder bridges between electrodes being thereby prevented;

(4) Since the second metal layers have resistance against soldering heat and are covered by the third metal layers, wettability can be maintained and the thermistor chip can be soldered easily; and (5) Since the first, second and fourth metal layers can be formed by a dry soldering method, electrical properties and mechanical strength of the thermistor chips are not adversely affected by wet soldering although the ceramic element is exposed unprotected.

Description of the invention is intended to be interpreted broadly. Many of the features of different embodiments of the invention described above may be combined, whenever appropriate. The invention also applies not only to thermistor blocks with a negative temperature characteristic but also to thermistor blocks with a positive temperature characteristic. Expressions like "resistance against soldering heat" and "wettability" are intended to be interpreted as commonly understood by ordinary persons skilled in the art. For example, if a sample is soaked in eutectic SnPb solder at 240° C. for 5 seconds and over 70% of the film surface remains, it may be defined to have resistance against soldering heat. Similarly, if a sample is soaked in such solder for 2 seconds and over 70% of the film area is covered by the new solder material, it may be defined to have wettability.

What is claimed is:

1. A method of making a thermistor chip comprising the steps of:

forming first metal layers with a three-layer structure at both end parts of a thermistor block having a surface area;

forming second metal layers with a three-layer structure on said first metal layers, said second metal layers each having an edge part which is formed so as to be in physical contact with said surface area of said thermistor block; and adjusting the normal temperature resistance value of said thermistor block.

2. The method of claim 1 further comprising the step of measuring the normal temperature resistance value of said thermistor block after said first metal layers are formed, said second metal layers being formed in such a manner that reduces the normal temperature resistance value of said thermistor block to thereby adjust the normal temperature resistance value of said thermistor block.

3. The method of claim 1 wherein said first metal layer and said second metal layer each comprise a lower layer made of a metal with resistance against soldering heat, a middle layer made of a metal with both wettability to solder and resistance against soldering heat, and an upper layer made of a metal having wettability to solder.

4. The method of claim 2 wherein said first metal layer and said second metal layer each comprise a lower layer made of a metal with resistance against soldering heat, a middle layer made of a metal with both wettability to solder and resistance against soldering heat, and an upper layer made of a metal having wettability to solder.

5. The method of claim 1 wherein said lower layer is made of a metal selected from the group consisting of Cr, Ni, Al, W and alloys thereof.

6. The method of claim 2 wherein said lower layer is made of a metal selected from the group consisting of Cr, Ni, Al, W and alloys thereof.

7. The method of claim 1 wherein said middle layer is made of a metal selected from the group consisting of Ni and Ni alloys.

8. The method of claim 2 wherein said middle layer is made of a metal selected from the group consisting of Ni and Ni alloys.

9. The method of claim 1 wherein said upper layer is made of a metal selected from the group consisting of Sn, Sn—Pb alloys and Ag.

10. The method of claim 2 wherein said upper layer is made of a metal selected from the group consisting of Sn, Sn—Pb alloys and Ag.

11. The method of claim 1 wherein said first and second metal layers are formed by a dry plating method.

12. The method of claim 2 wherein said first and second metal layers are formed by a dry plating method.

13. The method of claim 3 wherein said first and second metal layers are formed by a dry plating method.

14. The method of claim 4 wherein said first and second metal layers are formed by a dry plating method.

* * * * *